(12) United States Patent
Mao

(10) Patent No.: US 8,890,631 B2
(45) Date of Patent: Nov. 18, 2014

(54) MEMS OSCILLATOR AND MANUFACTURING METHOD THEREOF

(75) Inventor: Jianhong Mao, Shanghai (CN)

(73) Assignee: Lexvu Opto Microelectronics Technology (Shanghai) Ltd, Shanghai (CN)

(*) Notice: Subject to any disclaimer, the term of this patent is extended or adjusted under 35 U.S.C. 154(b) by 91 days.

(21) Appl. No.: 13/701,653

(22) PCT Filed: Dec. 13, 2010

(86) PCT No.: PCT/CN2010/079712
§ 371 (c)(1),
(2), (4) Date: Jan. 8, 2013

(87) PCT Pub. No.: WO2011/150641
PCT Pub. Date: Dec. 8, 2011

(65) Prior Publication Data
US 2013/0200957 A1   Aug. 8, 2013

(30) Foreign Application Priority Data

Jun. 4, 2010 (CN) .......................... 2010 1 0193493

(51) Int. Cl.
| | | |
|---|---|---|
| H01L 41/053 | (2006.01) | |
| H01L 41/083 | (2006.01) | |
| H01L 41/22 | (2013.01) | |
| H03B 5/30 | (2006.01) | |
| B81C 1/00 | (2006.01) | |
| H03H 3/007 | (2006.01) | |
| H03H 9/10 | (2006.01) | |
| H01L 41/27 | (2013.01) | |
| B81B 3/00 | (2006.01) | |
| B81B 7/00 | (2006.01) | |
| H03H 9/17 | (2006.01) | |
| H03H 3/02 | (2006.01) | |

(52) U.S. Cl.
CPC ............ *B81C 1/0019* (2013.01); *H03H 3/0072* (2013.01); *B81C 1/0023* (2013.01); *H03H 9/1057* (2013.01); *H01L 41/27* (2013.01); *H03B 5/30* (2013.01); *H01L 41/053* (2013.01); *B81B 3/0021* (2013.01); *B81B 7/0077* (2013.01); *H03H 9/173* (2013.01); *H03H 3/02* (2013.01); *H03H 9/1014* (2013.01); *H03H 9/17* (2013.01); *B81B 3/0018* (2013.01)
USPC ............ 331/154; 331/68; 29/25.35; 310/344; 310/349; 310/368; 438/51

(58) Field of Classification Search
CPC .. B81B 3/0018; B81B 3/0021; B81B 7/0077; B81C 1/0019; B81C 1/0023; G04F 5/04; G04F 5/06; G04F 5/063; H01L 41/053; H01L 41/083; H01L 41/0933; H01L 41/22; H01L 41/23; H01L 41/25; H01L 41/27; H03B 5/30; H03B 5/32; H03H 3/007; H03H 3/0072; H03H 3/02; H03H 3/08; H03H 9/05; H03H 9/10; H03H 9/1014; H03H 9/1057; H03H 9/15; H03H 9/17; H03H 9/173
USPC .......... 29/25.35; 257/698; 310/311, 344, 348, 310/349, 368; 331/68, 69, 154–156, 158; 438/50–52
See application file for complete search history.

(56) References Cited

U.S. PATENT DOCUMENTS

| | | | |
|---|---|---|---|
| 5,438,219 A | | 8/1995 | Kotzan et al. |
| 5,925,968 A | * | 7/1999 | Yachi et al. .................... 310/320 |
| 6,114,800 A | * | 9/2000 | Unami et al. ................. 310/344 |
| 6,278,337 B1 | | 8/2001 | Chan et al. |
| 6,310,421 B2 | * | 10/2001 | Morishima ............... 310/313 R |
| 6,445,254 B1 | * | 9/2002 | Shibuya et al. ................. 331/68 |
| 6,635,509 B1 | * | 10/2003 | Ouellet ......................... 438/106 |
| 6,808,954 B2 | * | 10/2004 | Ma et al. ......................... 438/51 |
| 7,456,042 B2 | * | 11/2008 | Stark et al. ...................... 438/50 |
| 7,876,168 B2 | * | 1/2011 | Matsuo ......................... 331/158 |
| 7,943,412 B2 | * | 5/2011 | Buchwalter et al. ............ 438/51 |
| 2008/0238575 A1 | * | 10/2008 | Tada et al. ..................... 333/186 |
| 2009/0066190 A1 | | 3/2009 | Harima |
| 2009/0137079 A1 | * | 5/2009 | Kuisma ........................... 438/51 |
| 2009/0149035 A1 | | 6/2009 | Aallos et al. |

FOREIGN PATENT DOCUMENTS

| | | |
|---|---|---|
| CN | 1897460 A | 1/2007 |
| CN | 101336512 A | 12/2008 |
| CN | 102270975 B | 10/2013 |

OTHER PUBLICATIONS

International Search Report (in Chinese with English translation) and Written Opinion (in Chinese) for PCT/CN2010/079712, mailed Mar. 24, 2011; ISA/CN \* cited by examiner

*Primary Examiner* — Levi Gannon
(74) *Attorney, Agent, or Firm* — Harness, Dickey & Pierce, P.L.C.

(57) ABSTRACT

A crystal oscillator and manufacturing method thereof are provided. The crystal oscillator includes: a semiconductor substrate; an interlayer dielectric layer located on the surface of the semiconductor substrate, an excitation plate and a positive electrode plug and a negative electrode plug being formed inside the interlayer dielectric layer, and the positive electrode plug and the negative electrode plug being located at the both sides of the excitation plate; a bottom cavity on top of the excitation plate, located between the positive electrode plug and the negative electrode plug; a vibrating crystal located on the surface of the interlayer dielectric layer, across the bottom cavity and connected with the positive electrode plug and the negative plug, wherein the vibrating crystal connects the positive electrode plug and the negative electrode plug at its both sides and besides the other both sides are the free ends and do not contact with the surrounding objects; an isolating layer located on top of the interlayer dielectric layer, a gap between the isolating layer and the vibrating crystal thus forming a top cavity; a covering layer formed on the surface of the isolating layer. The crystal oscillator is manufactured based on Complementary Metal-Oxide-Semiconductor Transistor (CMOS) technology, and can be integrated into the semiconductor chip easily and can meet the requirement for the miniature components.

16 Claims, 6 Drawing Sheets providing a substrate; forming an interlayer dielectric layer on the substrate, the interlayer dielectric layer forming an drive plate, an anode plug and a cathode plug therein, the anode plug and the cathode plug extending through the interlayer dielectric layer — S101 etching a part of the interlayer dielectric layer, which is located between the anode plug and the cathode plug and above the drive plate, for forming a groove; filling the groove for forming a first sacrifice layer — S102 forming an oscillating crystal on the interlayer dielectric layer and the first sacrifice layer, the oscillating crystal traversing the groove, opposite sides of the oscillating crystal contacting the anode plug and the cathode plug respectively — S103 forming a second sacrifice layer on the oscillating crystal; forming an isolating layer on surfaces of the second sacrifice layer — S104 etching the isolating layer for forming through holes, the through holes exposing the second sacrifice layer; removing the first sacrifice layer and the second sacrifice layer through the through holes — S105 forming a covering layer on the isolating layer for covering the through holes — S106

Fig.2

MEMS OSCILLATOR AND MANUFACTURING METHOD THEREOF

CROSS-REFERENCE TO RELATED APPLICATIONS

The present application is a 371 U.S. National Stage of International Application No. PCT/CN2010/079712, filed on Dec. 13, 2010, and claims the priority of Chinese Patent Application No 201010193493.7, entitled "MEMS oscillator and manufacturing method thereof", and filed Jun. 4, 2010, the entire disclosures of which are incorporated herein by reference.

FIELD OF THE INVENTION

The present invention relates to the manufacturing field for semiconductor apparatus, particularly to a MEMS oscillator and manufacturing method thereof based on CMOS process.

BACKGROUND OF THE INVENTION

A crystal oscillator is an important device in integrated circuit. The crystal oscillator generates regular oscillations in crystal material (common material comprise quartz and germanium etc) chiefly through active drive or passive reactance network. The accuracy of oscillations frequency is unbeatable and the oscillations are capable of being clock signals. The frequency of the clock signals is multiplied or divided through a frequency generator for further obtaining a conventional counting pulse and a clock cycle etc.

FIG. 1 schematically illustrates a crystal oscillator in prior art. The crystal oscillator comprises an insulation shell 2, an oscillating crystal 1, supporting columns and a drive plate 3. A closed cavity is surrounded by the insulation shell 2. The oscillating crystal 1 is located in the closed cavity. Opposite terminals of the oscillating crystal 1 are supported by the supporting columns, and thus the oscillating crystal 1 is suspended in the closed cavity. The supporting columns may be an anode and a cathode which are connected with the oscillating crystal 1. The drive plate 3 is arranged on one side of oscillating crystal 1 in the closed cavity for inducing the oscillating crystal 1 to generate oscillations. While working, the oscillating crystal 1 is electrified through the anode and the cathode, and then drive plate 3 is electrified to form electric field in the closed cavity. Thus subject to the electric field, the oscillating crystal 1 generates regular oscillations and outputs clock signals with fixed frequency through the anode and the cathode.

Current crystal oscillators are encapsulated as discrete devices and are arranged outside a semiconductor chip, which is not beneficial to reduce the size of integrated circuit. As density of circuit element increases and area of circuit restricts, dimension of crystal oscillators is required higher and higher. Although MEMS (Micro-Electro-Mechanical Systems, MEMS) technology is developed and mechanical electrical devices with micron grade and submicron grade have been fabricated, current semiconductor chip manufacturing process bases on CMOS process, and crystal oscillators and semiconductor chip are difficult to be fabricated uniformly only depending on MEMS technology. Therefore, a crystal oscillator and manufacturing method of the crystal oscillator which base on CMOS process is urgently demanded.

SUMMARY OF THE INVENTION

An object of the present invention is to provide a MEMS oscillator and manufacturing method of the MEMS oscillator, wherein the manufacturing method is compatible with CMOS process and MEMS oscillator is easy to fabricate in a semiconductor chip.

To achieve the object, the present invention provides a method for manufacturing a MEMS oscillator. The method comprises following steps. A substrate is provided. An interlayer dielectric layer is formed on the substrate, and forms a drive plate therein. An anode plug and a cathode plug are provided at opposite sides of the drive plat, respectively. A part of the interlayer dielectric layer, which is located between the anode plug and the cathode plug, above the drive plate, is etched to form a groove. A first sacrifice layer is formed by filling the groove. An oscillating beam is formed on the interlayer dielectric layer and the first sacrifice layer, traversing the groove, opposite sides of the oscillating beam being connected to the anode plug and the cathode plug respectively, another opposite sides of the oscillating beam exposing the interlayer dielectric layer. A second sacrifice layer is formed on the oscillating beam. The second sacrifice layer connects with the first sacrifice layer. An isolating layer is formed on the second sacrifice layer. The isolating layer is etched for forming through holes. The through holes expose the second sacrifice layer. The first sacrifice layer and the second sacrifice layer are removed through the through holes. A covering layer is formed on the isolating layer for covering the through holes.

Optionally, a bottom of the groove is spaced apart from the drive plate by a part of the interlayer dielectric layer.

Optionally, side walls of the groove are respectively spaced apart from the anode plug and the cathode plug by a part of the interlayer dielectric layer.

Optionally, depth of the groove ranges from 0.5 μm to 4 μm and width of the groove ranges from 5 μm to 50 μm.

Optionally, the oscillating beam is made of poly silicon germanium.

Optionally, thickness of the oscillating beam ranges from 3 μm to 15 μm.

Optionally, thickness of the second sacrifice layer ranges from 2 μm to 20 μm.

Optionally, the first sacrifice layer and the second sacrifice layer are made of amorphous carbon.

Optionally, removing the first sacrifice layer and the second sacrifice layer comprises introducing oxygen plasma to the through holes by oxygen ashing process for oxidizing the amorphous carbon to an oxide in gaseous state.

Optionally, removing the first sacrifice layer and the second sacrifice layer are implemented at a high temperature which ranges from 350 centigrade to 450 centigrade.

A MEMS oscillator comprises a substrate, an interlayer dielectric layer, an oscillating beam, an isolating layer and a covering layer. The interlayer dielectric layer is located on the substrate and forms a drive plate therein. An anode plug and a cathode plug are provided at opposite sides of the drive plate, respectively. A lower cavity is defined between the anode plug and the cathode plug and above the drive plate. The oscillating beam is located on interlayer dielectric layer and traverses the lower cavity for contacting and supporting the anode plug and the cathode plug. The oscillating beam is free relative to ambient except connection with the anode plug and the cathode plug. The isolating layer is located above the interlayer dielectric layer. An upper cavity is formed between the isolating layer and the oscillating beam. The covering layer is formed on the isolating layer.

Optionally, a bottom of the lower cavity is spaced apart from the drive plate by a part of the interlayer dielectric layer.

Optionally, depth of the lower cavity ranges from 0.5 μm to 4 μm and width of the lower cavity ranges from 5 μm to 50 μm.

Optionally, the oscillating beam is made of poly silicon germanium.

Optionally, thickness of the oscillating beam ranges from 3 μm to 15 μm.

Optionally, the upper cavity between the isolating layer and the oscillating beam ranges from 2 μm to 20 μm.

The manufacturing method of the MEMS oscillator of present invention is compatible with CMOS process. Dimension of the MEMS oscillator of present invention is reduced, thereby reducing size of apparatus, correspondingly. The MEMS oscillator of present invention is simple in structure, and is easily fabricated and integrated in a semiconductor chip.

BRIEF DESCRIPTION OF THE DRAWINGS

The above-mentioned object, characteristics and advantages will be clearer through the detailed description of the preferred embodiments in accordance with the present invention taken in conjunction with the accompanying drawings. The same components in the drawings are denoted with the same reference signs. The drawings, not precisely plotted according to the scale, are used to show the major ideas of the present invention. In the accompanying drawings, the thicknesses of layers and regions are scaled up for the sake of clarity.

FIG. 2 schematically illustrates a flow chart of a method for manufacturing the MEMS oscillator of the present invention;

FIGS. 3-12 schematically illustrate a method for manufacturing the MEMS oscillator according to an embodiment of the present invention, wherein FIG. 7 is a cross section view taken along line 7-7 of FIG. 6.

DETAILED DESCRIPTION OF THE EMBODIMENTS

Current oscillating crystals in crystal oscillators mostly adopt quartz and germanium. Since the quartz and germanium is not compatible with CMOS process, the crystal oscillators are fabricated according to MEMS technology or mechanical processing as discrete devices and are arranged outside a semiconductor chip. The method for manufacturing the MEMS oscillator and material of MEMS oscillator of present invention are compatible with CMOS process, leading to easy integration of the MEMS oscillator into a semiconductor chip, thereby meeting the requirement of reduction in the size.

FIG. 2 schematically illustrates a flow chart of a method for manufacturing the MEMS oscillator of the present invention. The method comprises following steps.

S101, a substrate is provided. An interlayer dielectric layer is formed on the substrate, and forms a drive plate therein. An anode plug and a cathode plug are provided at opposite sides of the drive plat, respectively. The plugs and the drive plate may be fabricated by conventional standard CMOS interconnection process. Interconnection metal is filled in contact holes to form the plugs. The drive plate may be a conductor, being formed by etching interconnection metal layer.

S102, a part of the interlayer dielectric layer, which is located between the anode plug and the cathode plug, above the drive plate, is etched to form a groove. A first sacrifice layer is formed by filling the groove.

S103, an oscillating beam is formed on the interlayer dielectric layer and the first sacrifice layer, traversing the groove, opposite sides of the oscillating beam being connected to the anode plug and the cathode plug respectively, another opposite sides of the oscillating beam exposing the interlayer dielectric layer.

S104, a second sacrifice layer is formed on the oscillating beam. An isolating layer is formed on the second sacrifice layer.

S105, through holes are formed by etching the isolating layer, exposing the surface of the second sacrifice layer. The first sacrifice layer and the second sacrifice layer are removed through the through holes.

After removing the first sacrifice layer and the second sacrifice layer, a cavity receiving the oscillating beam is formed in the interior of the isolating layer. Bottom of the oscillating beam corresponds to the groove and the drive plate under the groove. Except opposite terminals of the oscillating beam are connected with the anode plug and the cathode plug, other parts of the oscillating beam are in suspension state, namely being free terminals, not contacting other object.

S106, a covering layer is formed on the isolating layer. The covering layer may plug up the through holes, thereby spacing the oscillating beam from outside.

The MEMS oscillator of the present invention and the method for manufacturing the MEMS oscillator will be further described with following embodiments.

Figure 1:
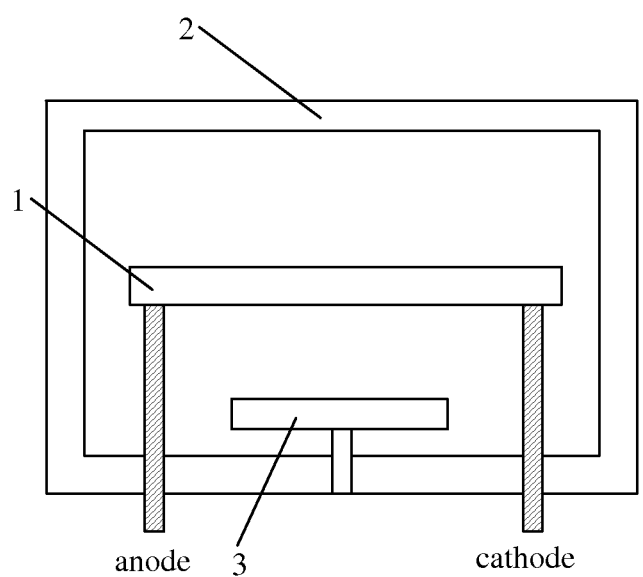
FIG. 1 schematically illustrates a crystal oscillator in prior art.
Figure 3:
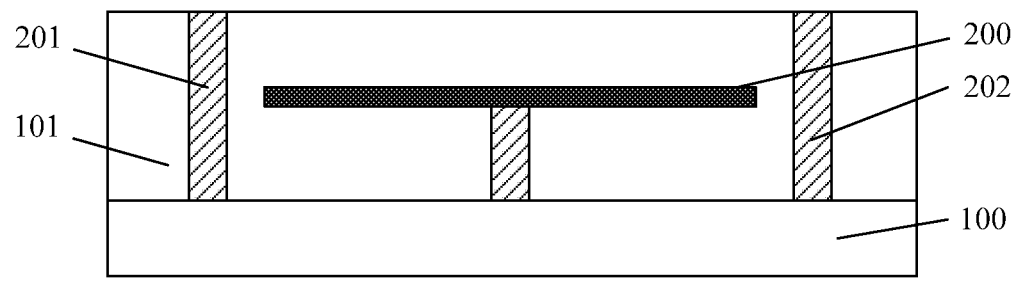

Referring to FIG. 3, a substrate 100 is provided. The substrate 100 may form metal interconnection or other semiconductor devices therein (not shown). An interlayer dielectric layer 101 is formed on the substrate 100. The interlayer dielectric layer 101 forms a drive plate 200, an anode plug 201 and a cathode plug 202 therein.

The drive plate 200, the anode plug 201 and the cathode plug 202 are formed in the interlayer dielectric layer 101 by metal interconnection process. The method comprises following steps. A first interlayer dielectric layer (not labeled) is formed on the substrate 100. An interconnection metal layer is formed on the first interlayer dielectric layer, and is patterned to form the drive plate 200. A second interlayer dielectric layer (not labeled) is formed on the first interlayer dielectric layer and the drive plate 200. The first interlayer dielectric layer and the second interlayer dielectric layer are etched until the substrate 100 is exposed, defining two contact holes (not labeled) through the substrate 100. The contact holes are located on two sides of the drive plate and do not contact the drive plate 200. The anode plug 201 and the cathode plug 202 are formed by filling the contact holes with interconnection metal. The interlayer dielectric layer 101, which includes the first interlayer dielectric layer and the second interlayer dielectric layer with the anode plug 201 and the cathode plug 202 therein, is completed. Thickness of the second interlayer dielectric layer approximately equals to the distance between the drive plate 200 and a top of the dielectric layer 101. A groove will be defined by the second interlayer dielectric layer in following step, and has a maximum depth depending on thickness of the second interlayer dielectric layer, and a maximum width of the groove depending on space between the anode plug 201 and the cathode plug 202.

In the embodiment, the thickness of the second interlayer dielectric layer ranges from 1 μm to 5.5 μm, and the space between the anode plug 201 and the cathode plug 202 ranges from 10 μm to 55 μm.

In the embodiment, the first interlayer dielectric layer and the second interlayer dielectric layer are conventional dielectric material, such as silicon oxide and silicon nitride etc. To take silicon oxide for an example in the embodiment, the first interlayer dielectric layer and the second interlayer dielectric layer may be formed by CVD (Chemical Vapor Deposition, CVD) process. The drive plate 200 is formed by etching an interconnection metal layer. The anode plug 201 and the cathode plug 202 are made of interconnection metal material. Tungsten, aluminum, cuprum and other conventional metal material may be used for being compatible with CMOS process.

According to the prior art, the drive plate 200 is used for forming electric field which induces the oscillating beam to oscillate. Thus the drive plate 200 may be metal material or other conductive material. The drive plate 200 may be fabricated by other conventional COMS process. As a common knowledge, a person skilled in the art should easily deduce specific method for manufacturing the drive plate 200. It may be redundant to describe details here.

Figure 4:
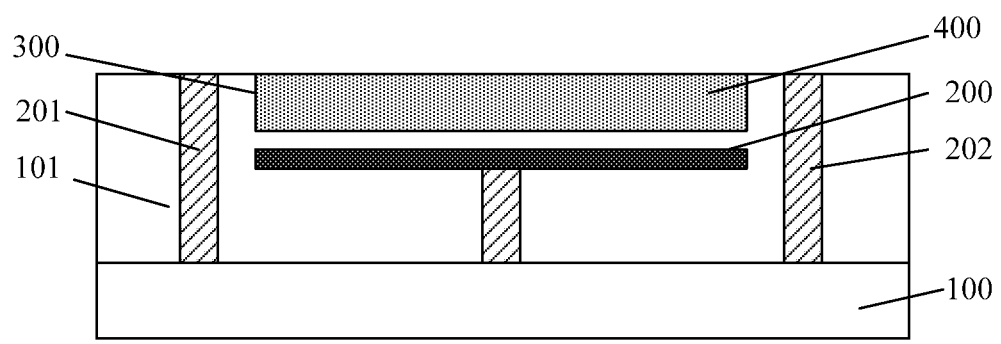

Referring to FIG. 4, a part of the interlayer dielectric layer 101, which is located between the anode plug 201 and the cathode plug 202 and above the drive plate, is etched to form a groove 300. The groove 300 is filled to form a sacrifice layer 400. A part of the sacrifice layer 400, which overflows the groove 300, is removed by planarization process. The planarization process comprises following steps. A photoresist is deposited on the interlayer dielectric layer 101. The photoresist is patterned according to the groove 300. The patterned photoresist serving as a hardmask, the interlayer dielectric layer 101 is etched by plasma etching process for forming the groove 300. The groove 300 is filled with the first sacrifice layer 400. The interlayer dielectric layer 101 and the sacrifice layer 400 are planarized by CMP (Chemical-Mechanical Polishing, CMP) process after the filling process is finished.

According to one embodiment, the drive plate 200 is exposed directly in a bottom of the groove 300. According to a preferred embodiment, in order to protect the drive plate 200 in following process, the bottom of the groove 300 is spaced apart from the drive plate 200 by a part of interlayer dielectric layer. Thus depth of the groove 300 is lower than the thickness of the second interlayer dielectric layer. Side walls of the groove 300 may directly expose the anode plug 201 or the cathode plug 202. In order to protect the anode plug 201 and the cathode plug 202 in following process, width of the groove may lower than the distance between the anode plug 201 and the cathode plug 202. In the embodiment, while etching the groove, the width of the groove is controlled by regulating the photoresist pattern, and the depth of groove is controlled by regulating the etching time. The depth of the groove 300 ranges from 0.5 μm to 5 μm and the width of the groove 300 ranges from 5 μm to 50 μm. The bottom of the groove 300 is spaced apart from the drive plate 200 by the interlayer dielectric layer whose thickness is 0.5 μm.

The first sacrifice layer 400 is used for supporting the oscillating beam in following process of forming the oscillating beam. Since the first sacrifice layer 400 will be removed finally, the material of the sacrifice layer 400 should be selected from material which is easy to remove. Preferably, the material of the first sacrifice layer 400 is selected from material with high etching rate compared with the interlayer dielectric layer 101 and oscillating beam, and thus other substance never want to be removed will be protected when removing the first sacrifice layer 400. For example, the first sacrifice layer 400 may be metal or metal oxide which is easy to be wet etched and deposited in the groove 300 by metal plating method (on this condition, the bottom and the side walls of the groove 300 must be spaced apart from the drive plate 200, the anode plug 201 and the cathode plug 202 by a part of interlayer dielectric layer), such as aluminum or cuprum etc. Or, the first sacrifice layer 400 may be material which is easy to be gasified and deposited on the groove 300 by CVD process, such as amorphous carbon. In the embodiment, the amorphous carbon is used as the sacrifice layer, which has following advantages. CVD process is compatible with CMOS process. The amorphous carbon fabricated by CVD is amorphous carbon which is comparatively compact and may be oxidized into carbon dioxide at a lower heating temperature (generally not exceed 500 centigrade), thus easily being oxidized to remove without remains and not effecting other parts.

Figure 5:
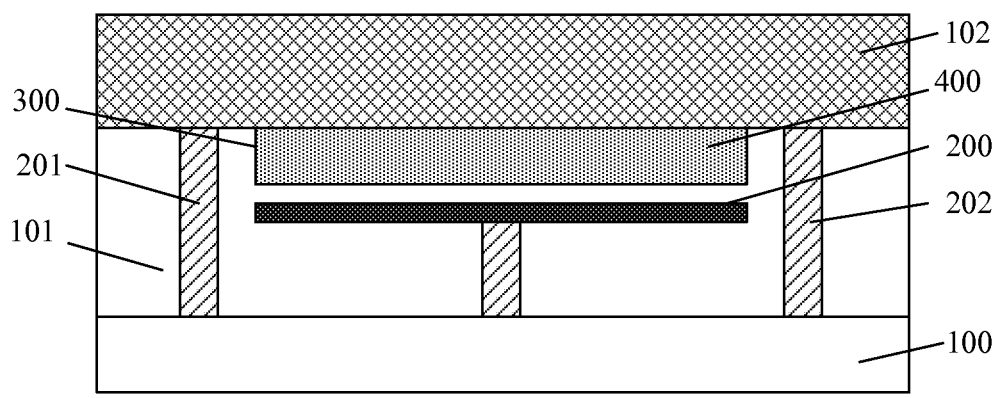

Referring to FIG. 5, a poly layer 102 is deposited on the interlayer dielectric layer 101 and the first sacrifice layer 400. In the embodiment, the poly layer 102 is poly silicon germanium, being fabricated by CVD. Thickness of the poly layer 102 ranges 3 μm to 15 μm. Poly silicon germanium is easy to generate regular oscillations when being induced (such as being electrified), which is the same as quartz. Poly silicon germanium is a conventional semiconductor material also. The oscillating beam in present invention is made of poly silicon germanium, being compatible with CMOS process, reducing process lost.

Figure 6:
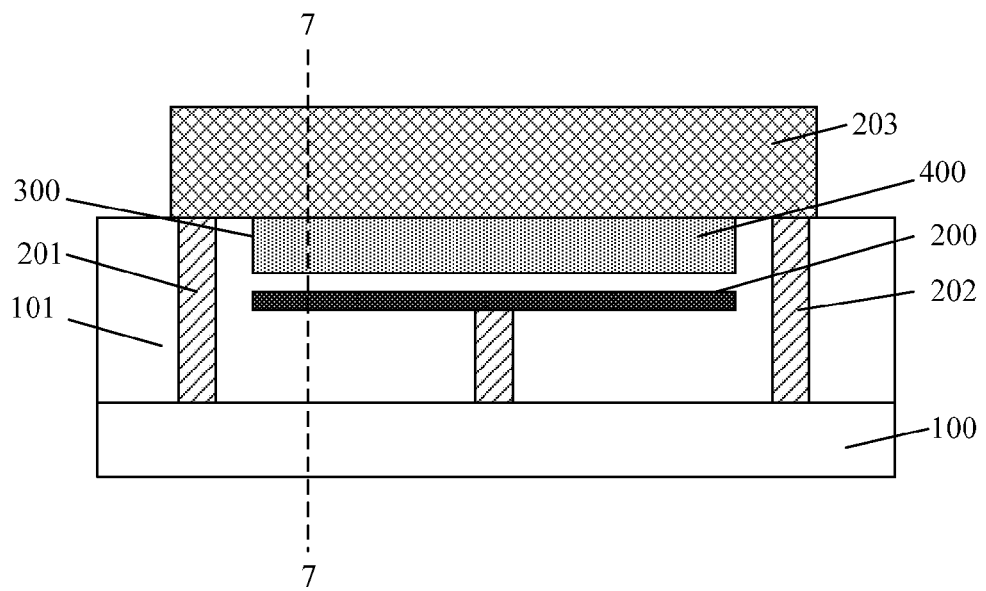

Referring to FIG. 6, the poly layer 102 is etched to form an oscillating beam 203. Position of the oscillating beam 203 corresponds to the groove 300 and the drive plate 200 under the groove 300. The oscillating beam 203 traverses the groove 300 and two terminals of the oscillating beam 203 connect the anode plug 201 and the cathode plug 202. Since the oscillating beam 203 achieves longitudinal oscillation, cavities should be formed above and under the oscillating beam 203 respectively, and two sides of the oscillating beam 203 not connected with electrodes are free. That is, the oscillating beam is free relative to ambient except connection with the anode plug and the cathode plug. In order to remove the first sacrifice layer 400 in the groove 300 located under the oscillating beam 203 and form a low cavity, the oscillating beam 203 does not cover over the entire groove 300. The two sides of the oscillating beam 203 which are free expose a part of the first sacrifice layer 400 in the groove 300.

Figure 7:
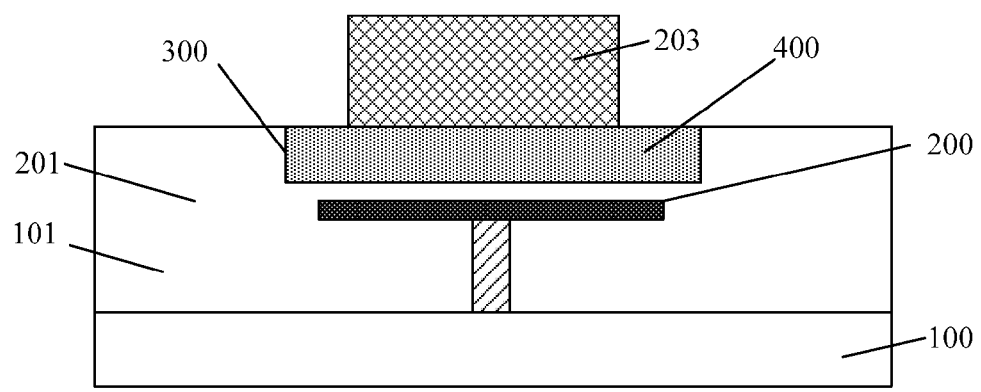

Referring to FIG. 6 and FIG. 7, as an embodiment of the present invention, the oscillating beam 203 is rectangle which has long side and short side. The oscillating beam 203 traverses the groove 300 along the long side direction. The oscillating beam 203 covers and connects the anode plug 201 and the cathode plug 202. The oscillating beam 203 exposes the first sacrifice layer 400 along the short side direction. The oscillating beam 203 is equally divided by the line between the anode plug 201 and the cathode plug 202.

The oscillating beam 203 may cover over the groove 300. When removing the first sacrifice layer 400 under the oscillating beam 203, a part of the oscillating beam 203 is etched to form an opening and the first sacrifice layer 400 is removed through the opening.

Figure 8:
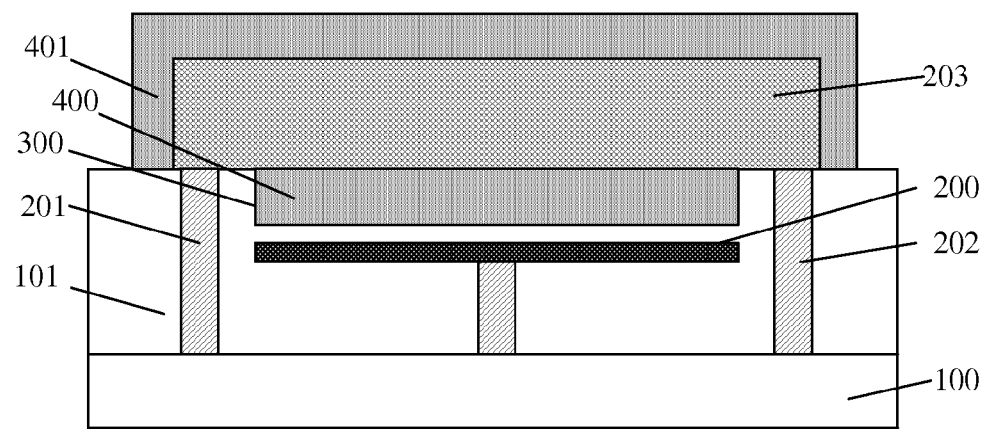

Referring to FIG. 8, a second sacrifice layer 401 is formed on the oscillating beam 203 and the interlayer dielectric layer 101. The second sacrifice layer 401 is etched to surround the oscillating beam 203 and to connect the first sacrifice layer 400. Further, in the embodiment, since the oscillating beam 203 does not cover over the groove 300, the second sacrifice layer 401 covers the exposed first sacrifice layer 400 or covers a part of the exposed first sacrifice layer 400 or exceeds the exposed first sacrifice layer 400, whereby the first sacrifice layer 400 and the second sacrifice layer 401 are connected together to surround the oscillating beam 203. When the first sacrifice layer 400 and the second sacrifice layer 401 are removed, except the oscillating beam 203 are connected with the anode plug 201 and the cathode plug 202, other parts of the oscillating beam 203 do not contact other objects, namely forming free terminals.

As stated above, since the oscillating beam 203 achieves longitudinal oscillation, an upper cavity should be formed above the oscillating beam 203, and thus the thickness of the second sacrifice layer 401 is the space of the upper cavity above the oscillating beam 203. The lower cavity and the upper cavity compose a cavity for receiving the oscillating beam 203. To simplify the processes, the first sacrifice layer 400 and the second sacrifice layer 401 are made of the same material which is easy to be removed in the embodiment. Please refer to the descriptions of the first sacrifice layer for detail descriptions. The thickness of the second sacrifice layer ranges from 2 μm to 20 μm.

Figure 9:
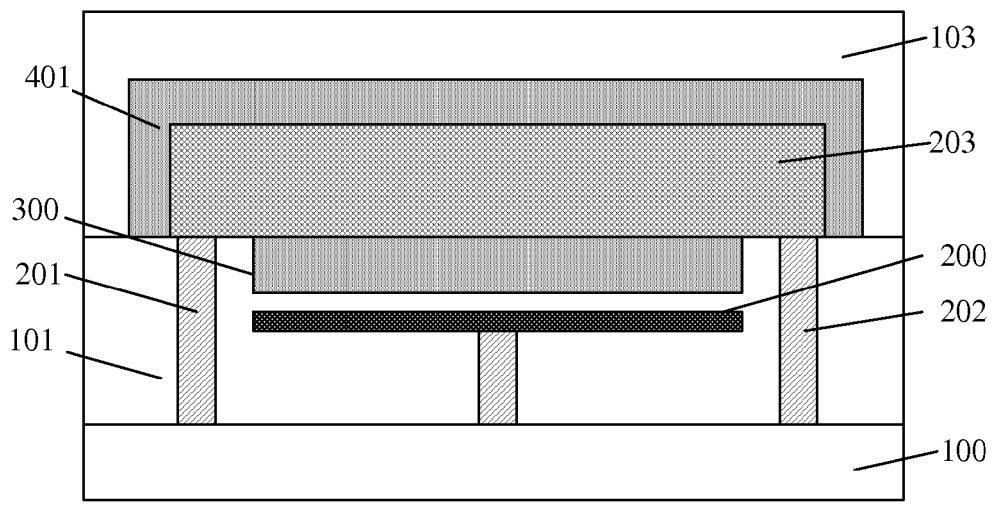

Referring to FIG. 9, an isolating layer 103 is formed on the second sacrifice layer 401. The isolating layer 103 is used for insulating and protecting the oscillating beam 203 therein. The isolating layer 103 is made of silicon oxide or silicon nitride. To simplify the process, the isolating layer 103 and the interlayer dielectric layer 101 adopt silicon oxide, being deposited by CVD process. The oscillating beam 203, the second sacrifice layer 401 and the isolating layer 103 are orderly arranged from inside to outside.

Figure 10:
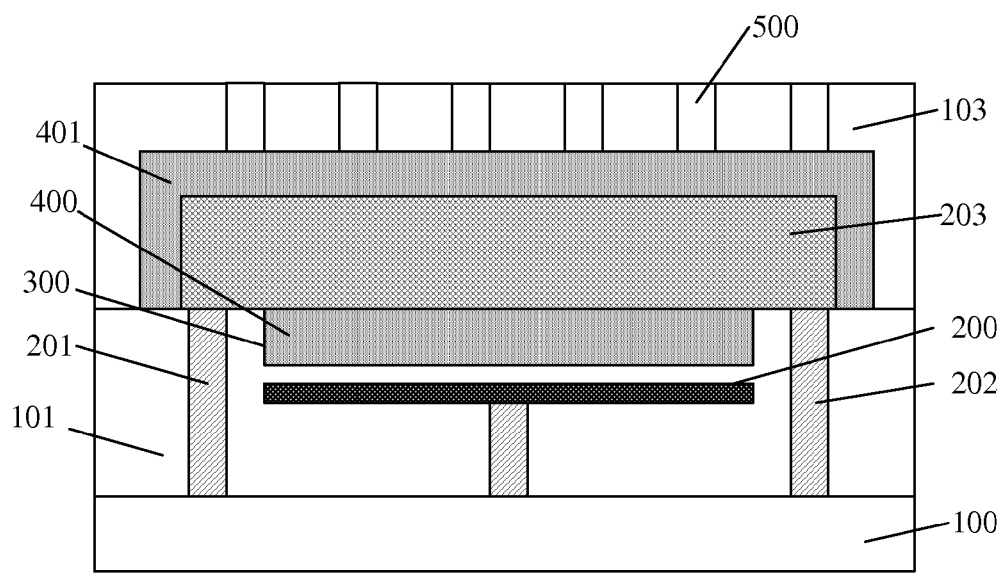

Referring to FIG. 10, several through holes 500 exposing the second sacrifice layer 40 are formed in the isolating layer 103. The through holes 500 are formed by plasma etching process. Gases and liquids are introduced through the through holes 500 to remove the first sacrifice layer 400 and the second sacrifice layer 401. Depth to width ratio should not be too big, which may avoid plugging up difficultly in deposit process. The depth to width ratio should not be too small, which may influence the effect of removing the sacrifice layers. The depth to width ratio should be adjusted according to the material and removing method of the sacrifice layers. A person skilled in the art may adjust according to the principles mentioned above and a preferred range is obtained by limited experiments. The depth to width ratio of the through holes ranges from 3 to 5.

Figure 11:
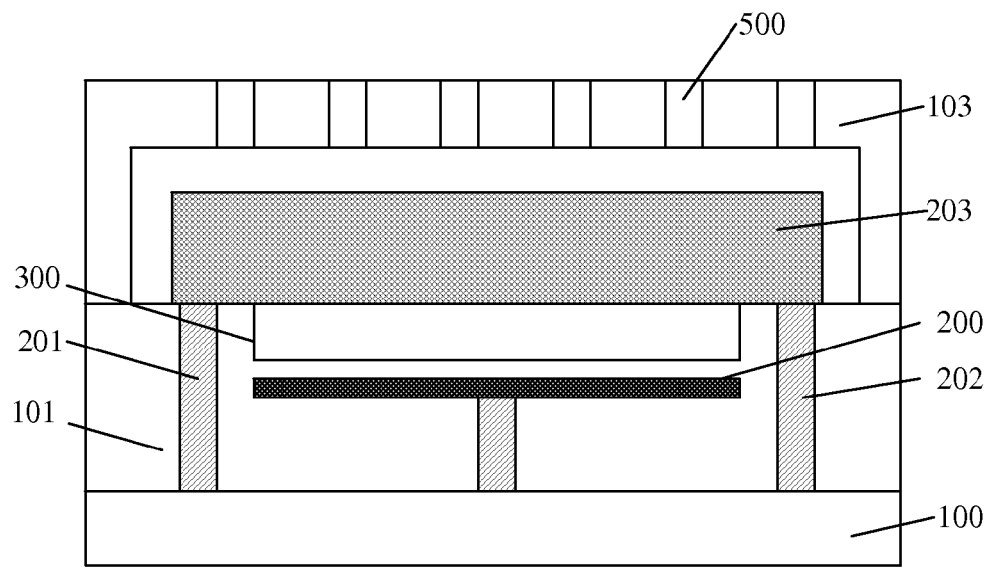

Referring to FIG. 11, a removing material is introduced through the through holes 500 to remove the first sacrifice layer 400 and the second sacrifice layer 401.

Specifically, as stated above, if the first sacrifice layer 400 and the second sacrifice layer 401 are aluminum or cuprum, the removing material is phosphorous acid. In the embodiment, since the first sacrifice layer 400 and the second sacrifice layer 401 are compact amorphous carbon which is fabricated according CVD process, the removing material is oxygen and heating temperature ranges from 350 centigrade to 450 centigrade. Oxygen plasma is introduced to the through holes by oxygen ashing process for oxidizing the amorphous carbon to an oxide in gaseous state. At the temperature, the compact amorphous carbon will not burn intensely, but will be oxidized to carbon dioxide gas. The carbon dioxide gas is expelled from the through holes and the sacrifice layers are removed, thereby protecting other parts of the apparatus. After the first sacrifice layer 400 is removed, the oscillating beam 203 is arranged in a cavum structure being within the isolating layer 103.

Figure 12:
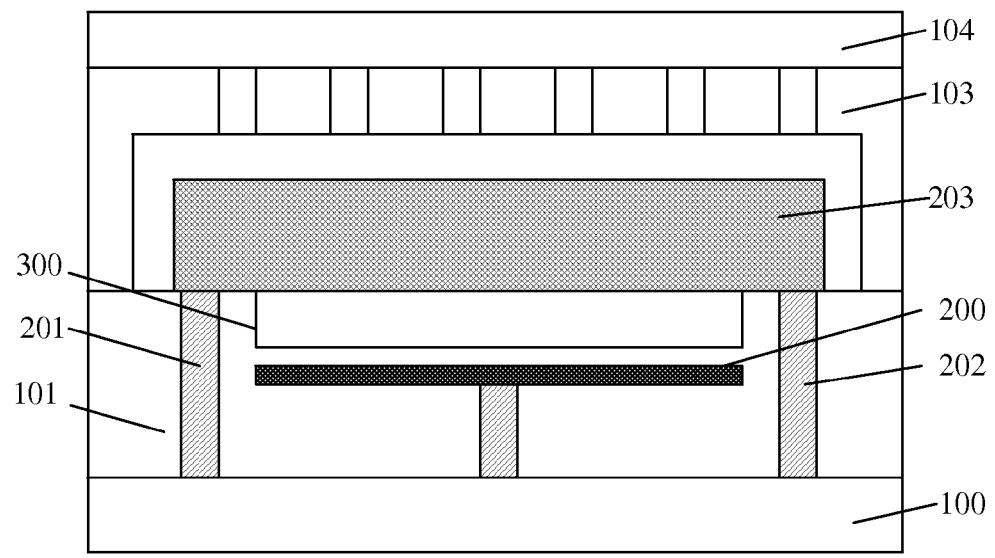

Referring to FIG. 12, a covering layer 104 is formed on the isolating layer 103. The covering layer 104 may be formed by CVD process. If the depth to width ratio of through holes 500 is small enough, the covering layer 104 would easy to plug up the through holes 500 and would not extend through the cavum structure being within the isolating layer 103. To simplify the processes, the covering layer 104 is made of silicon oxide.

A MEMS oscillator of the present invention is formed according to the processes stated above. Referring to FIG. 12, the MEMS oscillator comprises a substrate 100, an interlayer dielectric layer 101, a lower cavity, an oscillating beam 203, an isolating layer 103 and a covering layer 104. The interlayer dielectric layer 101 is located on the substrate 100. The interlayer dielectric layer 101 forms a drive plate 200 therein, and an anode plug 201 and a cathode plug 202 at opposite sides of the drive plate respectively. The lower cavity is located between the anode plug 201 and the cathode plug 202, above the drive plate 200. The oscillating beam 203 is located on the top of interlayer dielectric layer 101 and traverses the lower cavity. The oscillating beam 203 is connected with the anode plug 201 and the cathode plug 202. The oscillating beam 203 is free relative to ambient, except connection with the anode plug 201 and the cathode plug 202. The isolating layer 103 is located above the interlayer dielectric layer 101. An upper cavity is formed by spaces between the isolating layer 103 and the oscillating beam 203. The covering layer 104 is formed on the isolating layer 103.

While working, the oscillating beam 203 establishes a current therein through the anode plug 201 and the cathode plug 202. For example, the cathode plug 202 is grounded and a positive voltage is applied to the anode plug 201. The potential of the drive plate 200 is adjusted to form electric field in the closed cavity, thereby inducing the oscillating beam 203 to generate regular longitudinal oscillations. Oscillations frequency is determined by the material of the oscillating beam 203. Size of the upper cavity and the lower cavity located on two sides of the oscillating beam 203 is relevant to the thickness of the first sacrifice layer and second sacrifice layer. As known by a person skilled in the art, for the oscillating beam oscillates stably, the size of the layers may be determined according to actual conditions. The present invention is not limited by the specific implementations disclosed hereinafter.

The MEMS oscillator and the method for manufacturing the MEMS oscillator of the present invention, especially selection of material and forming processes, are compatible with CMOS process. Thus the MEMS oscillator is easily integrated in a semiconductor chip and fabricated together with the semiconductor chip, thereby reducing the fabrication cost of integrated circuit, improving density of the apparatus and meeting the requirement of reduction in the size.

Apparently, those skilled in the art should recognize that various variations and modifications can be made without departing from the spirit and scope of the present invention. Therefore, if these variations and modifications fall into the scope defined by the claims of the present invention and its equivalents, then the present invention intends to cover these variations and modifications.

What is claimed is:

1. A method for manufacturing a MEMS oscillator, comprising:
    providing a substrate;
    forming an interlayer dielectric layer on the substrate, the interlayer dielectric layer forming an drive plate, an anode plug and a cathode plug therein, the anode plug and the cathode plug extending through the interlayer dielectric layer;
    etching a part of the interlayer dielectric layer, which is located between the anode plug and the cathode plug and above the drive plate, for forming a groove;
    filling the groove for forming a first sacrifice layer;
    forming an oscillating beam on the interlayer dielectric layer and the first sacrifice layer, the oscillating beam traversing the groove, opposite sides of the oscillating beam contacting the anode plug and the cathode plug respectively, another opposite sides of the oscillating beam exposing the interlayer dielectric layer;
    forming a second sacrifice layer on the oscillating beam, the second sacrifice layer connecting with the first sacrifice layer;

forming an isolating layer on the second sacrifice layer;
etching the isolating layer for forming through holes, the through holes exposing the second sacrifice layer;
removing the first sacrifice layer and the second sacrifice layer through the through holes; and
forming a covering layer on the isolating layer for covering the through holes,
wherein a bottom of the groove is spaced apart from the drive plate by a part of the interlayer dielectric layer.

2. The method according to claim 1, wherein side walls of the groove are respectively spaced apart from the anode plug and the cathode plug by a part of the interlayer dielectric layer.

3. The method according to claim 2, wherein depth of the groove ranges from 0.5 μm to 4 μm and width of the groove ranges from 5 μm to 50 μm.

4. The method according to claim 1, wherein depth of the groove ranges from 0.5 μm to 4 μm and width of the groove ranges from 5 μm to 50 μm.

5. The method according to claim 1, wherein the oscillating beam is made of poly silicon germanium.

6. The method according to claim 5, wherein thickness of the oscillating beam ranges from 3 μm to 15 μm.

7. The method according to claim 1, wherein thickness of the second sacrifice layer ranges from 2 μm to 20 μm.

8. The method according to claim 1, wherein the first sacrifice layer and the second sacrifice layer are made of amorphous carbon.

9. The method according to claim 8, wherein removing the first sacrifice layer and the second sacrifice layer comprises introducing oxygen plasma to the through holes by oxygen ashing process for oxidizing the amorphous carbon to an oxide in gaseous state.

10. The method according to claim 9, wherein removing the first sacrifice layer and the second sacrifice layer are implemented at a high temperature which ranges from 350 centigrade to 450 centigrade.

11. A MEMS oscillator comprising:
a substrate;
an interlayer dielectric layer being located on the substrate, the interlayer dielectric layer forming a drive plate therein, and an anode plug and a cathode plug at opposite sides of the drive plate respectively, a lower cavity being defined between the anode plug and the cathode plug and above the drive plate;
an oscillating beam being located on interlayer dielectric layer and traversing the lower cavity for contacting and supporting the anode plug and the cathode plug, the oscillating beam being free relative to ambient except connection with the anode plug and the cathode plug;
an isolating layer being located above the interlayer dielectric layer, an upper cavity being formed between the isolating layer and the oscillating beam; and
a covering layer being formed on the isolating layer,
wherein a bottom of the lower cavity is spaced apart from the drive plate by a part of the interlayer dielectric layer.

12. The MEMS oscillator according to claim 11, wherein depth of the lower cavity ranges from 0.5 μm to 4 μm and width of the lower cavity ranges from 5 μm to 50 μm.

13. The MEMS oscillator according to claim 11, wherein the oscillating beam is made of poly silicon germanium.

14. The MEMS oscillator according to claim 11, wherein thickness of the oscillating beam ranges from 3 μm to 15 μm.

15. The MEMS oscillator according to claim 11, wherein the upper cavity between the isolating layer and the oscillating beam ranges from 2 μm to 20 μm.

16. A method for manufacturing a MEMS oscillator, comprising:
providing a substrate;
forming an interlayer dielectric layer on the substrate, the interlayer dielectric layer forming an drive plate, an anode plug and a cathode plug therein, the anode plug and the cathode plug extending through the interlayer dielectric layer;
etching a part of the interlayer dielectric layer, which is located between the anode plug and the cathode plug and above the drive plate, for forming a groove;
filling the groove for forming a first sacrifice layer;
forming an oscillating beam on the interlayer dielectric layer and the first sacrifice layer, the oscillating beam traversing the groove, opposite sides of the oscillating beam contacting the anode plug and the cathode plug respectively, another opposite sides of the oscillating beam exposing the interlayer dielectric layer;
forming a second sacrifice layer on the oscillating beam, the second sacrifice layer connecting with the first sacrifice layer;
forming an isolating layer on the second sacrifice layer;
etching the isolating layer for forming through holes, the through holes exposing the second sacrifice layer;
removing the first sacrifice layer and the second sacrifice layer through the through holes; and
forming a covering layer on the isolating layer for covering the through holes,
wherein side walls of the groove are respectively spaced apart from the anode plug and the cathode plug by a part of the interlayer dielectric layer.

* * * * *